United States Patent [19]

Ohki

[11] 4,216,029
[45] Aug. 5, 1980

[54] METHOD OF MAKING STATIC INDUCTION TRANSISTOR LOGIC

[75] Inventor: Toshimi Ohki, Tokyo, Japan

[73] Assignee: Kabushiki Kaisha Daini Seikosha, Japan

[21] Appl. No.: 888,621

[22] Filed: Mar. 21, 1978

[30] Foreign Application Priority Data

Mar. 28, 1977 [JP] Japan .................................. 52-34185

[51] Int. Cl.² .................... H01L 29/78; H01L 29/80
[52] U.S. Cl. ...................................... 148/1.5; 357/22; 357/23; 357/91
[58] Field of Search ............................ 357/22, 91, 23; 148/1.5

[56] References Cited

U.S. PATENT DOCUMENTS

| 4,045,251 | 8/1977 | Graul et al. | 148/1.5 |
| 4,115,793 | 9/1978 | Nishizawa | 357/22 |

OTHER PUBLICATIONS

Reddi et al., "Ion-Implantation for ... Si Devices ...", Solid St. Techn., Oct. 1972, 35.
Lee et al., "Ion-Implanted S/C Devices", Proc. IEEE, 62, (1974), 1241.
Allen, ". . . Implantation Profile Control", Electronics Letts., (Mar. 1969), 111.

Nishizawa et al., "Field-Effect Transistors ... ", IEEE Trans.-vol. ED22 (1975), p. 185.

Primary Examiner—L. Dewayne Rutledge
Assistant Examiner—Upendra Roy
Attorney, Agent, or Firm—Robert E. Burns; Emmanuel J. Lobato; Bruce L. Adams

[57] ABSTRACT

A method of fabricating a static induction transistor device comprising providing a semiconductor substrate having a high impurity concentration, and forming a low impurity concentration semiconductor layer of the same conductivity type as the substrate on a surface of the substrate. Next, a high impurity concentration semiconductor region of the same conductivity type as the substrate is formed in a surface of the semiconductor layer formed on the substrate to define a drain region of the device. An ion implanted semiconductor region having a high impurity concentration and a conductivity type opposite the substrate is formed in the semiconductor layer and concentric with the drain region, beneath the surface of the semiconductor layer, and the ion implanted region is diffused within the semiconductor region to form a semiconductor region having a high impurity concentration in the semiconductor layer and of a conductivity type opposite the semiconductor layer and surrounding the drain region at the surface of the semiconductor layer and having a tubelike shape extending downward into the semiconductor region toward the source region of the device.

4 Claims, 8 Drawing Figures

METHOD OF MAKING STATIC INDUCTION TRANSISTOR LOGIC

BACKGROUND OF THE INVENTION

This invention relates to a static induction transistor logic device (hereafter called SITL), and particularly to a method of forming the gate region thereof by ion implementation and bringing the maximum of the diffusion potential induced in the channel thereof closer to the source of the device.

The conventional SITL comprises an injector 5 and the static induction transistor for switching a conductive path between the substrate 1 acting as the source thereof and the drain 4 by controlling a height of a barrier with changing a potential of the gate region 3 which is used for the barrier of carrier transfer. The barrier is caused by a diffusion potential which is made from a junction between the epitaxial layer 2, having a sufficient low impurity concentration and formed on the substrate by the epitaxial method or the like, and the gate region 3 having a high impurity concentration and a polarity opposite that of the epitaxial layer 2 as shown in FIG. 1.

For example the substrate 1 is N+, the epitaxial layer 2 is formed N−, the gate region 3 and the injector 5 are P+ and the drain 4 is N+. Hitherto the said P+ gate region 3 has been formed by heat-diffusion of boron (B) and the shape of gate region 3 (P+ region) becomes arc shaped in section having radius r centering around the mask ends A before diffusion according to the diffusion time of the boron as shown in FIG. 2. As a result, the distribution of a diffusion potential caused by the junction between the P+ of gate region 3 and the N− of epitaxial layer 2 has a distribution as shown on the dotted line in the FIG. 2. The potential becomes higher toward the arrow directions and the maximum value of the potential P occurs at a distance X from the substrate 1 come out a source as shown by the curve a of FIG. 3 from the view of B-B' portion of intrinsic channel region. In the case that the maximum potential is located at a distant X from the source, when the gate has a positive bias (curve b) applied thereto and the drain also has a positive bias (curve c) applied thereto, it takes time for electrons injected from the source to reach the point of maximum potential P by diffusion transfer. Therefore, conventional SITL is not suitable for high frequency operation. An attempt to bring the point of maximum potential P closer to the source has been to form the lower parts of gate-region 3 during the growth of epitaxial layer 2, and with the rest of the gate region 3 diffused into the epitaxial layer after the epitaxial layer has been grown.

In this construction, the point of maximum potential P is located at the narrowest portion of the space inside the gate, so that in spite of improving the characteristic, the fabricating process is made more complex which results in lowering the yield rate and increasing the cost of fabrication.

SUMMARY OF THE INVENTION

The object of the present invention is to provide a SITL having simple fabricating process and excellent high frequency characteristic by eliminating the conventional defects mentioned above and bringing the point of maximum diffusion potential close to the source by means of an ion implantation fabrication method.

DESCRIPTION OF THE PREFERRED EMBODIMENT

Figure 1:
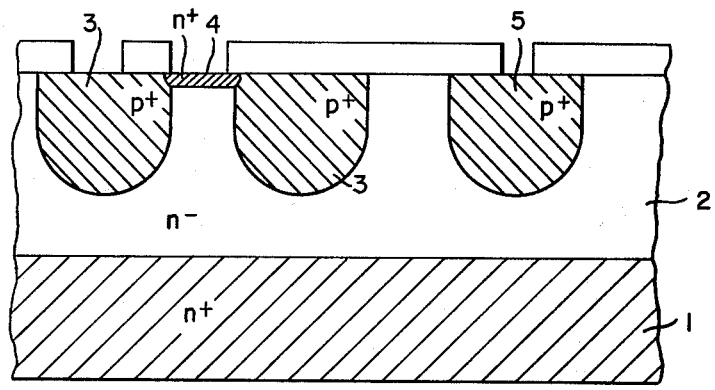
FIG. 1 is a sectional view shown the conventional SITL.
Figure 2:
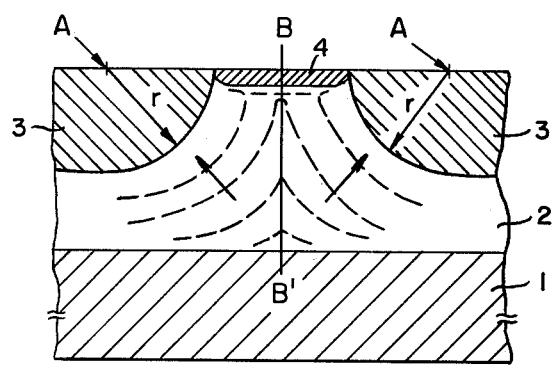
FIG. 2 is a detailed view of the channel structure of conventional SITL.
Figure 3:
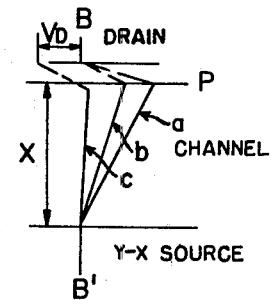
FIG. 3 is a schematic diagram of diffusion potentials of the channel.
Figure 4:
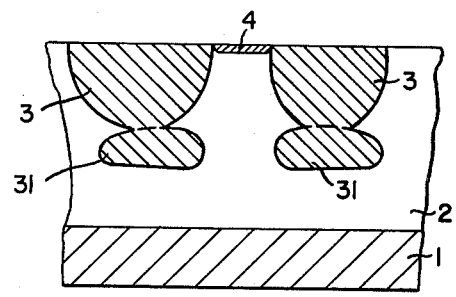
FIG. 4 is a sectional view of SITL formed by conventional double thermal diffusion method.
Figure 5:
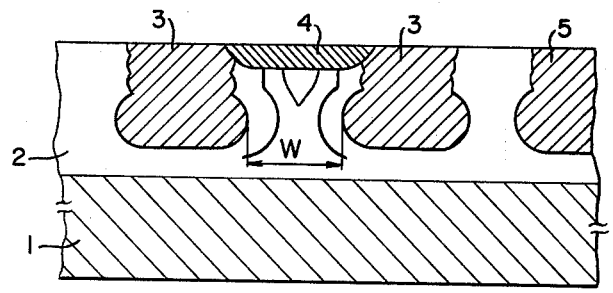
FIG. 5 is a sectional view of SITL according to this invention.

The detail of this invention will be described as follows according to the drawings. FIG. 5 illustrates the preferred embodiment of SITL in accordance with this invention, in which the N+ substrate 1 having impurity concentration on the order of $10^{18}/cm^3$ defines a source region and the N− epitaxial layer 2 having impurity concentration on the order of $10^{13}/cm^3$ and about 4 μm thickness is formed on the substrate 1 and the gate 3 and the injector 5 are formed in the epitaxial layer 2. The gate and the injector both have a bottom expanded sectional shape and are formed by means of ion implantation. The impurity concentration of said gate is on the order of $10^{18}/cm^3$ and the depths thereof are about 3.0 μm from the surface thereof and further the narrowest portion of the channel is located at a depth of about 2 μm from the surface thereof. The drain 4 thereof having a thickness less than 1 μm and an impurity concentration on the order of $10^{19}/cm^3$ is formed on said channel. Hereafter forming of oxide film and wiring are performed but these steps are not shown in the figures, and finally the fabrication of said element is completed.

The essential point of this invention is the sectional shape of the gate expanded at the bottom thereof. The fabricating process which results in this gate shape will be described as follows.

Figure 6:
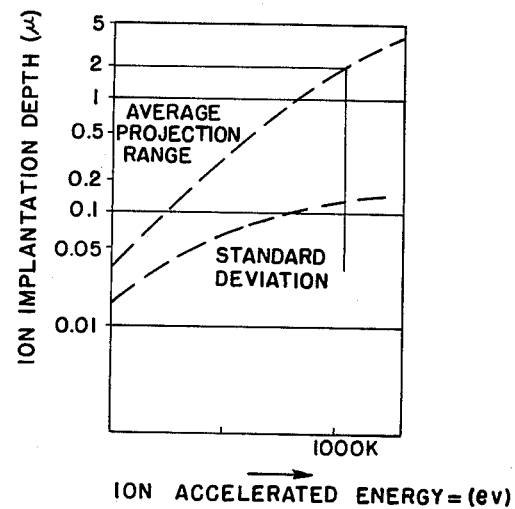
FIG. 6 is a diagram of ion distribution resulting from the ion implantation method.
Figure 7A:
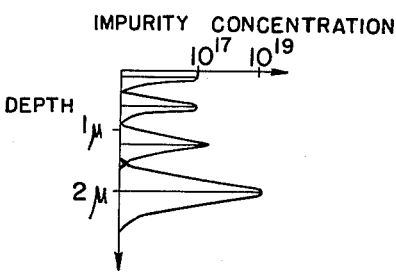
FIGS. 7a and 7b illustrate the ion distribution realized by using the stepped ion implanting method according to the present invention and a sectional view of the resulting gate after diffusion, respectively.
Figure 7B:
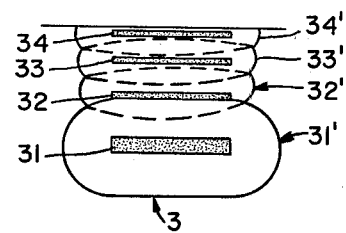

FIG. 6 is a diagram of average projection range and standard deviation thereof for different values of ion acceleration energy when boron-ion is injected in a Si-substrate. For example, when the boron-ion is injected with an acceleration energy of 1,000 Kev, the boron has a mean depth of about 2 μm from the surface of said Si-substrate and is distributed according to the Gaussian distribution of standard deviation of about 0.1 μm. And as the concentration thereof can be controlled by the implanting time and ion beam current, the depth and concentration of boron are able to be selected. In this embodiment, at the beginning the implanting operation is performed to achieve about 2 μm depth with high impurity concentration (about $1 \times 10^{19}$) and subsequently 1.2 μm, 0.6 μm and 0.2 μm depths in that order with comparatively low concentration ($1 \times 10^{17}$) as shown in the FIG. 7(a). And these implanting operations are performed through the same mask and therefore the plane shapes of the implanted regions are approximately the same as shown by 31, 32, and 34 respectively in the FIG. 7(b). These ion implanted regions are implanted concentrically although there are some differences in expansion in the lateral directions thereof. Hereafter, the operations of electric activation and diffusion from the ion implanted regions are achieved by annealing the device. The diffusion progresses from the highest concentration portion 31, expands to the position 31 very fast and the other portions 32, 33 and 34 are respectively expanded to 32′, 33′, 33′ and 33′, so as a result the sectional shape of P+ region 3 becomes as shown in FIGS. 5 and 7b.

As described above, the gate formed by the stepped ion implantation method and bringing the narrow portion of the channel width close to the source side also brings the maximum diffusion potential due to the junction between the gate 3 and the epitaxial layer 2 close to the source. In this embodiment it is as close as 2 μm from the source. Accordingly when the gate 3 is biased with a positive voltage and the drain 4 is positively biased, the electrons injected from the source 1 reach the potential barrier faster than in a device having a conventional channel structure and after crossing over the maximum potential the electrons reach the drain by drift.

Due to the above features, the SITL of this invention displays the essential characteristics thereof one of which is improved operating speed and another of which is decreased parasitic capacitance by using low impurity concentration regions. The fact that the distance to the potential barrier is short decreases the probability of recombination of the electrons from the source with the holes from the gate in the channel region and the equivalent resistance of the channel region has a very low value since the rate at which electrons reach the drain becomes high. On the other hand, the narrowest breadth W of the channel can be easily controlled within a small value since it does not influence the thickness of the drain region as compared with traditional method so that the height of the potential barrier can be larger and also the equivalent resistance at the time of applying zero bias to the gates can be larger. For this reason, the voltage amplitude of the device output is very close to the bias voltage between the source and drain, with resultant improvement in operation as a logic circuit element.

Further, in the description of this embodiment the structure thereof is formed with an N− layer on the N-type substrate but this invention can be also applied to the following structure; a P-type substrate defining the source and a P− epitaxial layer thereon and defining the channel region in which there is an N+ gate. Furthermore, it is very effective to perform the ion implantation operations divided into several separate steps, but it is clearly possible to gain a similar effect by a single ion implantation step if the distance between the source and the drain is short and if the drain is sufficiently thin.

I claim:

1. A method of fabricating a static induction transistor logic device, comprising:
    providing a semiconductor substrate having a high impurity concentration of a first conductivity type;
    forming a semiconductor layer on a surface of said substrate having a low impurity concentration on the order of an intrinsic semiconductor and of the first conductivity type;
    forming a semiconductor region having a high impurity concentration of the first conductivity type in a surface of said semiconductor layer formed on said substrate, wherein the semiconductor region having a high impurity concentration of the first conductivity type constitutes a drain region of the device;
    forming by ion implantation a semiconductor region having a high impurity concentration of a second conductivity type opposite said substrate in the semiconductor layer and concentric with the drain region beneath the surface of the semiconductor layer; and
    diffusing the ion implanted region within the semiconductor layer to form a semiconductor region having a high impurity concentration of the second conductivity type in the semiconductor layer and surrounding the drain region at the surface of the semiconductor layer and having a tubelike shape extending downward into the semiconductor layer toward the source region.

2. A method of fabricating a static induction transistor logic device according to claim 1, wherein the step of forming by ion implantation further comprises forming by ion implantation a sequence of high impurity concentration semiconductor regions within the semiconductor layer at different depths with the deepest region having the highest impurity concentration.

3. A static induction transistor logic device made according to the method of claim 1.

4. A method of fabricating a static induction transistor logic device according to claim 2, wherein forming by ion implantation the sequence of high impurity concentration semiconductor regions within the semiconductor layer at different depths is comprised of:
    ion implanting impurity atoms in the semiconductor layer at a depth of about 2 μm and a concentration on the order of $10^{19}/cm^3$; and
    then ion implanting impurity atoms in the semiconductor layer at depths of 1.2 μm, 0.6 μm and 0.2 μm, successively, and a concentration on the order of $10^{17}/cm^3$ at each depth.

* * * * *